United States Patent [19]
Oeftering et al.

[11] Patent Number: 5,549,237
[45] Date of Patent: Aug. 27, 1996

[54] APPARATUS AND METHOD FOR COLD WELDING THIN WAFERS TO HARD SUBSTRATES

[75] Inventors: Richard C. Oeftering, Elyria; Floyd A. Smith, Cleveland, both of Ohio

[73] Assignee: The United States of America as represented by the Administrator of the National Aeronautics and Space Administration, Washington, D.C.

[21] Appl. No.: 390,460

[22] Filed: Feb. 16, 1995

[51] Int. Cl.⁶ .......................... B23K 20/16; B23K 20/24
[52] U.S. Cl. .......................... 228/116; 228/208; 228/3.1; 118/50; 118/500
[58] Field of Search .................................. 228/115, 116, 228/194, 212, 221, 208, 3.1, 6.1, 49.1; 427/295; 118/50, 500

[56] References Cited

U.S. PATENT DOCUMENTS

| | | | |
|---|---|---|---|
| 4,011,982 | 3/1977 | Marancik | 228/117 |
| 4,196,837 | 4/1980 | Burkart et al. | 228/116 |
| 4,245,768 | 1/1981 | Sater | 228/116 |
| 4,247,034 | 1/1981 | Burkart et al. | 228/116 |
| 4,452,389 | 6/1984 | Amin | 228/116 |
| 5,148,958 | 9/1992 | Eskandari et al. | 228/3.1 |
| 5,186,379 | 2/1993 | Helber, Jr. | 228/116 |
| 5,279,724 | 1/1994 | Rauch et al. | 204/298.09 |

*Primary Examiner*—Samuel M. Heinrich
*Attorney, Agent, or Firm*—Kent N. Stone; Gene Shook

[57] ABSTRACT

An apparatus for coating and bonding parts in a vacuum includes a floating mount assembly holding one part and applying a bonding load to the parts. A pivoting mount assembly holds one part and is pivoted between a coating position and a bonding position. At least one coating source is provided for depositing a thin film of a metal onto a surface of each of the parts to improve the cold weld between the two parts. A restraining lever controls the application of the bonding load to the parts. The coating and bonding process occurs in a vacuum chamber with a single set-up.

26 Claims, 8 Drawing Sheets

APPARATUS AND METHOD FOR COLD WELDING THIN WAFERS TO HARD SUBSTRATES

ORIGIN OF THE INVENTION

The invention described herein was made by employees of the U.S. Government and may be manufactured and used by or for the U.S. Government without the payment of any royalties thereon or therefor.

FIELD OF THE INVENTION

This invention relates to bonding non-metallic parts together in general and, more particularly, to applying thin film metals to the parts and cold welding the parts together. An apparatus and method are disclosed for applying a thin metal film to the parts and for subsequently cold welding the parts together.

BACKGROUND OF THE INVENTION

In cold welding, pressure is applied to the parts to be welded, causing plastic deformation at the surfaces of the parts in contact. The surfaces bond together forming microwelds. Under ideal conditions and in the absence of any absorbed layers of gas or liquid films, and other contaminants and oxide layers, the surfaces are close enough to each other to form interatomic bonds. This bonding mechanism can be utilized as a joining process for two dissimilar or similar materials, although, the best bonding by cold welding is typically obtained with two similar metals. When bonding two dissimilar metals that are mutually soluble, brittle intermetallic compounds may form, thus resulting in a weak joint.

Cold welding can be used in situations where it is desired to bond two parts together with a thin metallic film interposed therebetween. Thin films of a common metal can be forced together to create a joint that is strong structurally but is also so thin that it has negligible effect on the transmission of acoustic waves. For high frequency acoustic devices (e.g., ultrasonic transducers), thin metallic films are used to conduct electric current, transmit acoustic energy and provide a defect free structural bond. The metallic film provides a structural bond between the device's two primary components (e.g., a piezoelectric device and a buffer rod). A buffer rod, typically a ceramic, such as sapphire, serves as a physical support for the otherwise fragile piezoelectric device, such as, a crystal and acts as an acoustic transmission and coupling device which transmits the acoustic waves into the object or medium being tested. Indium, a relatively soft metal, exhibits good cold welding properties and is frequently used in electro-acoustic applications.

Indium cold welding requires the mating surfaces to be free of oxide formation. Therefore an inert atmosphere must be present to prevent oxidation. A high vacuum is preferred in this invention because it eliminates the risk of trapping gas pockets in the bonding operation. This implies that the coating and bonding operations must be done in a single setup inside a vacuum system without ever exposing the hardware to air until the bonding is complete.

In the prior art, stationary mounts hold the transducer crystal and the buffer rod for coating in a vacuum. When coating is complete, the two pieces are removed from the vacuum of the coating system and the pieces are bonded together in a normal atmosphere environment. This causes oxides to form on the otherwise pristine coating surfaces. As a consequence, the cold weld bond is inferior.

In some instances, an inert gas atmosphere is used to avoid oxide formation. During the bonding process, however, small pockets of gas will be trapped in the bond interface. This causes discontinuities in the bond and acoustic beam distortion.

Alternatively, the bonding can be performed inside a vacuum system without removing the parts or exposing them to the atmosphere. In this situation the prior art relied on the use of complex remote manipulators to position the components so that the mating surfaces would face each other. The bonding force is then applied usually by using a small hydraulic press. Unfortunately such hydraulic systems pose a substantial risk of contaminating the vacuum system due to fluid leakage. Further, the hydraulic fluid is supplied by an external pressure source that requires transport lines to be routed into the chamber, which restricts the allowable motion of the system within the vacuum chamber.

U.S. Pat. No. 5,148,958 to Eskandari et al. discloses a thin film vacuum cold welding system. A substrate and a transducer are translationally aligned in separate chucks and axially spaced from each other such that a bidirectional sputtering source can coat the substrate and the transducer. After the coating is complete, the sputtering source is rotated out of alignment with the substrate and the transducer. The separate chucks are then pressed together by a piston assembly to cold weld the surfaces of the substrate and the transducer together. The coating and welding processes are performed under vacuum.

U.S. Pat. Nos. 4,247,034 and 4,196,837, both to Burkart et al., disclose a method of indirectly connecting two parts, such as a quartz part and piezoelectric part, by applying relatively thin metallic layers under vacuum conditions onto the surfaces to be joined. A vacuum-chamber system having no ventilation is provided to join the surfaces together to form a permanent bond between such layers. Indium may be used as the thin metallic layer to join the surfaces together. An intermediate layer may be applied in the vacuum system onto connective surfaces of the parts to be joined prior to the application of the metallic coatings. The intermediate layer may be lead-free glass.

Visual access to high vacuum systems with multiple plating sources is very constrained and visibility is highly obscured. Without direct visual access, accurate alignment of the parts cannot be achieved. Because of this alignment uncertainty, features such as focusing lenses can only be added once the location of the transducer's acoustic beam was determined by testing. Therefore the exact location of the acoustic beam center is done only after the transducer is bonded.

The addition of the acoustic lens after bonding means that a method using a buffer rod with a preground lens could not be employed, and the possible set-up and production cost savings could not be gained. The grinding of the acoustic lens after bonding exposes the fragile piezoelectric crystal to the risk of chipping and scratching damage which frequently results in scrapped products. Consistency from unit to unit also was not easily attainable. The prior art resulted in hand-made, one-of-a-kind products that have not had widespread adoption due to low yield rates and high unit costs.

SUMMARY OF THE INVENTION

The invention provides an improved apparatus and method for coating and bonding a pair of parts of any suitable material, such as metals or nonmetals, together in a vacuum chamber. A floating mount assembly is provided for holding one of the parts and for providing a spring biased bonding force to the parts. A pivoting mount assembly holds the other part. The pivoting mount assembly pivots between a coating position and a bonding position. In the coating position, the pivoting mount assembly and the floating mount assembly orient the bonding surfaces of each part in the same direction. With this arrangement, the bonding surfaces can be simultaneously coated with a thin film material of uniform thickness. In the bonding position, the pivoting mount assembly is rotated such that the bonding surfaces face each other. The floating block assembly uses a purely mechanical form of energy storage to apply a bonding force. As a result, no external hydraulic supply or electric supply are needed to perform the bonding operation and operate the floating block assembly and the pivoting mount assembly.

BRIEF DESCRIPTION OF THE DRAWINGS

The invention will be described in detail with reference to the following drawings in which like reference numerals refer to like elements and wherein.

DETAILED DESCRIPTION OF THE PREFERRED EMBODIMENTS

Figure 1:
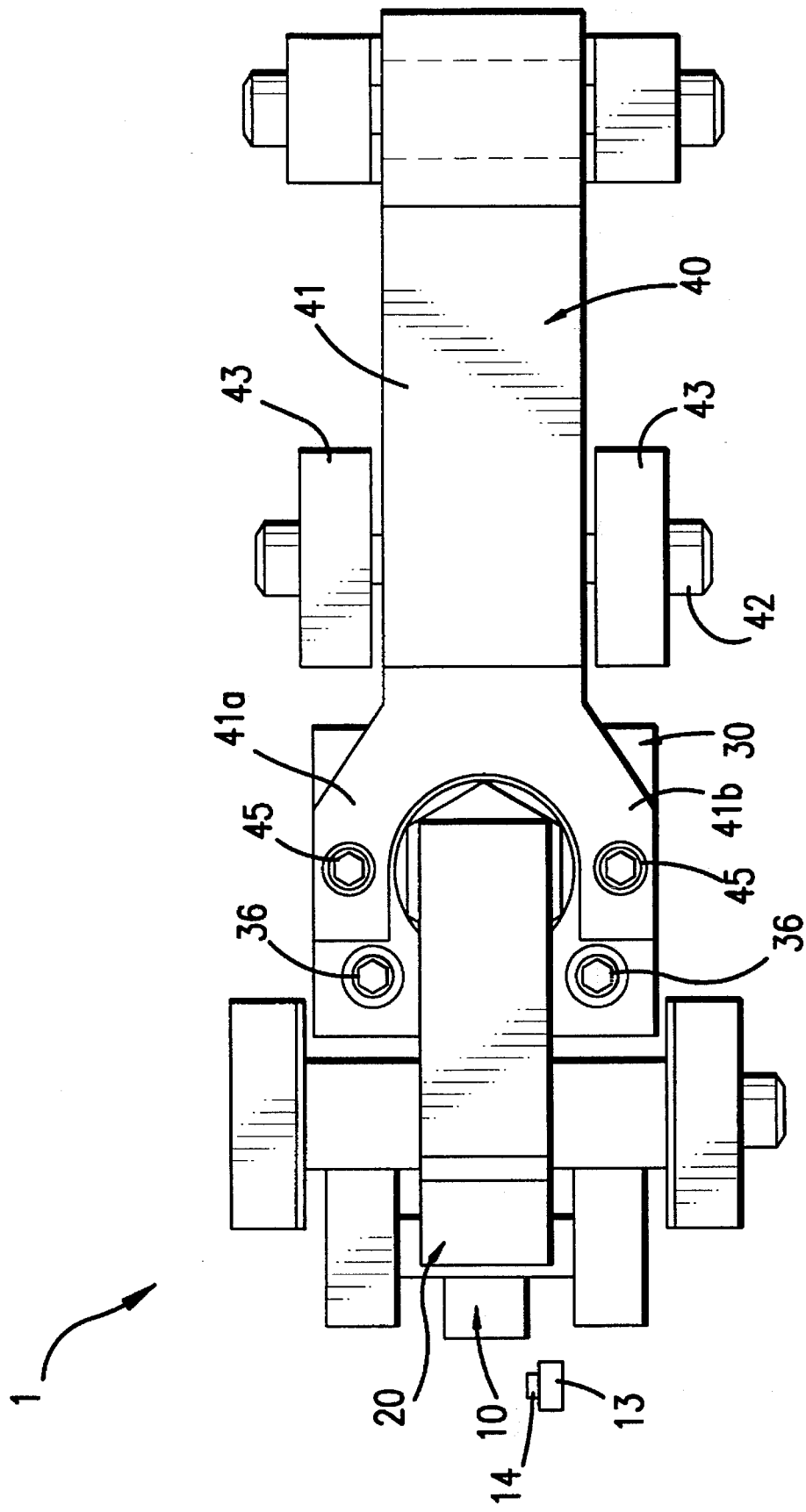
FIG. 1 is a top view of the latch assembly, positioning arm, floating collet spring block assembly and restraint lever according to an embodiment of the present invention.
Figure 2:
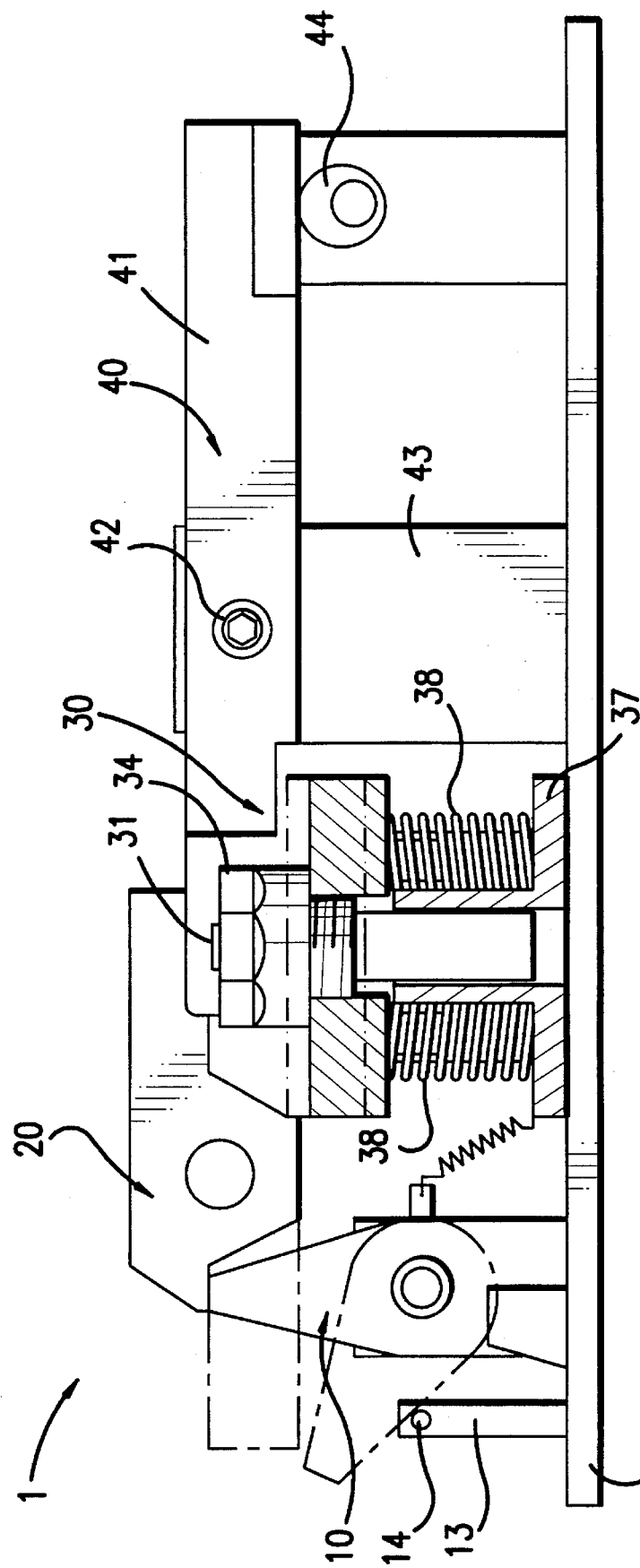
FIG. 2 is a side view of the latch assembly, positioning arm, floating collet spring block assembly and restraint lever shown in FIG. 1.

FIGS. 1 and 2 disclose top and side views, respectively, of a spring biased latch assembly 10, a positioning arm 20, a floating collet spring block assembly 30 and a restraint lever 40 which collectively form a fixture mounting device 1. The fixture mounting device 1 supports part 101 (e.g., a non-metallic part, as for example, a thin and possibly fragile transducer crystal wafer such as a lithium niobate crystal) and part 102 (e.g., a non-metallic part, as for example, a buffer rod such as a ceramic Like sapphire) within a vacuum chamber assembly 4, shown in FIG. 13, during coating and subsequent bonding of the parts 101 and 102. The fixture mounting device 1 is attached to a fixture adapter plate 2.

Figure 10:
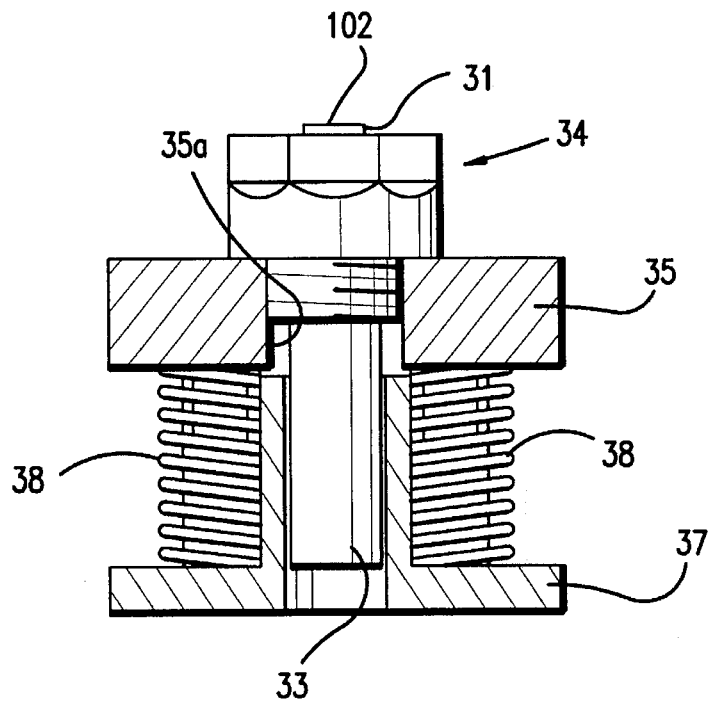
FIG. 10 is a sectional view of the floating collet spring block assembly.
Figure 11:
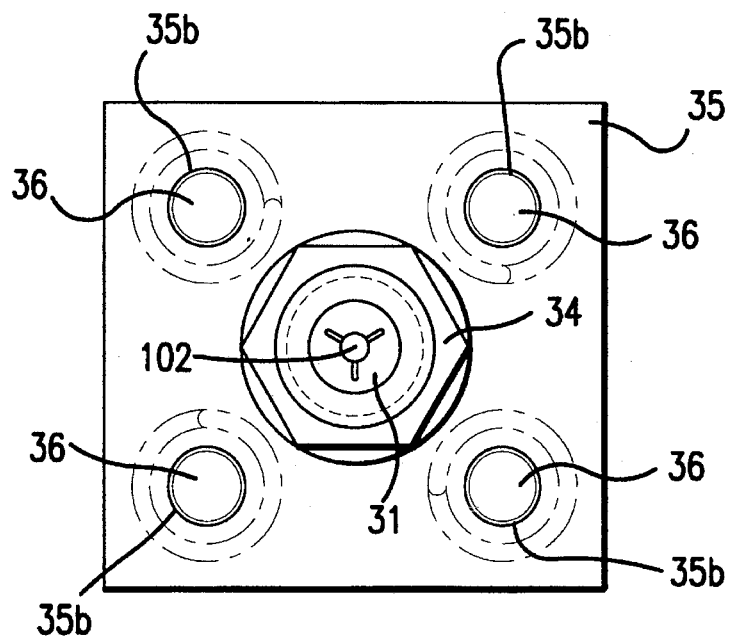
FIG. 11 is a top view of the floating collet spring block assembly shown in FIG. 10.
Figure 12:
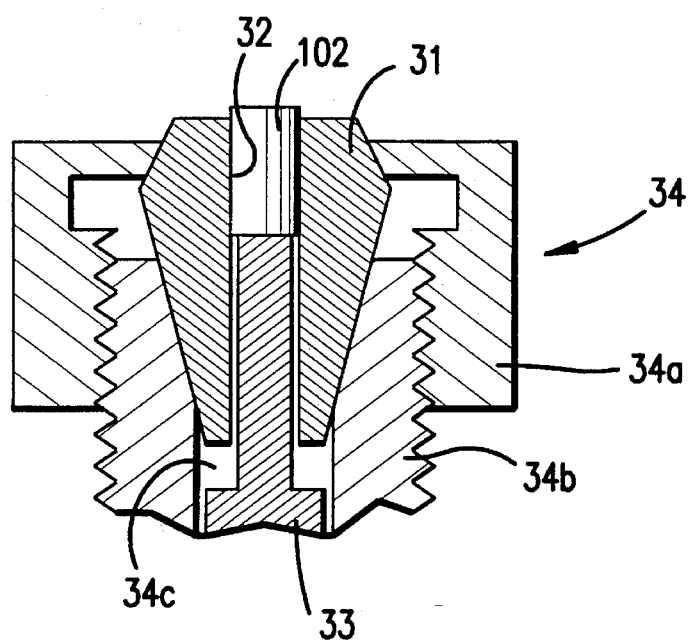
FIG. 12 is an enlarged sectional view of the collet, the collet holder and buffer rod of the floating collet spring block assembly shown in FIG. 10.

Prior to the coating of parts 101 and 102, part 102 is secured in the floating collet spring block assembly 30, shown in FIGS. 10–12. Part 102 is inserted in a central opening 32 in a collet 31. The opening 32 is internally threaded to receive a threaded collet stop shaft 33. The threaded collet stop shaft 33 engages part 102 to prevent movement of the part 102 during the bonding operation. The collet 31 is secured within a collet holder 34 having an externally threaded sleeve 34b. The collet 31 and the collet stop shaft 33 are located within a channel 34c extending through sleeve 34b. An internally threaded cap 34a is threaded on the sleeve 34b to secure the collet 31 within the sleeve 34b. The cap 34a includes an opening through which a portion of the collet 31 and the part 102 extend, as shown in FIG. 12. The collet holder 34 is then positioned within an opening 35a in top plate 35.

Spring post screws 36 extend through openings 35b in the top plate 35 of the floating collet spring block assembly 30. The spring post screws 36 are secured to a bottom mount assembly 37. The mount assembly 37 is secured to the fixture adapter plate 2. Coil springs 38 surround the spring post screws 36 to bias the top plate away from the mount assembly 37. Belleville washers or other suitable biasing assemblies may be substituted for the coil springs 38. The tension in the springs 38 can be adjusted, for example, by trimming the springs to reduce tension or by inserting washers or shims between the spring and the block assembly to increase tension. This will adjust the forces the springs 38 exert on the top plate 35. The screws 36 act as stops to prevent excessive travel of the collet assembly. The top plate 35 transfers the forces exerted by the springs to the collet 31 and the part 102 during the bonding operation. With this arrangement, a bonding load can be applied to the parts and calibrated without the use of external electrical and hydraulic connections.

Figure 3:
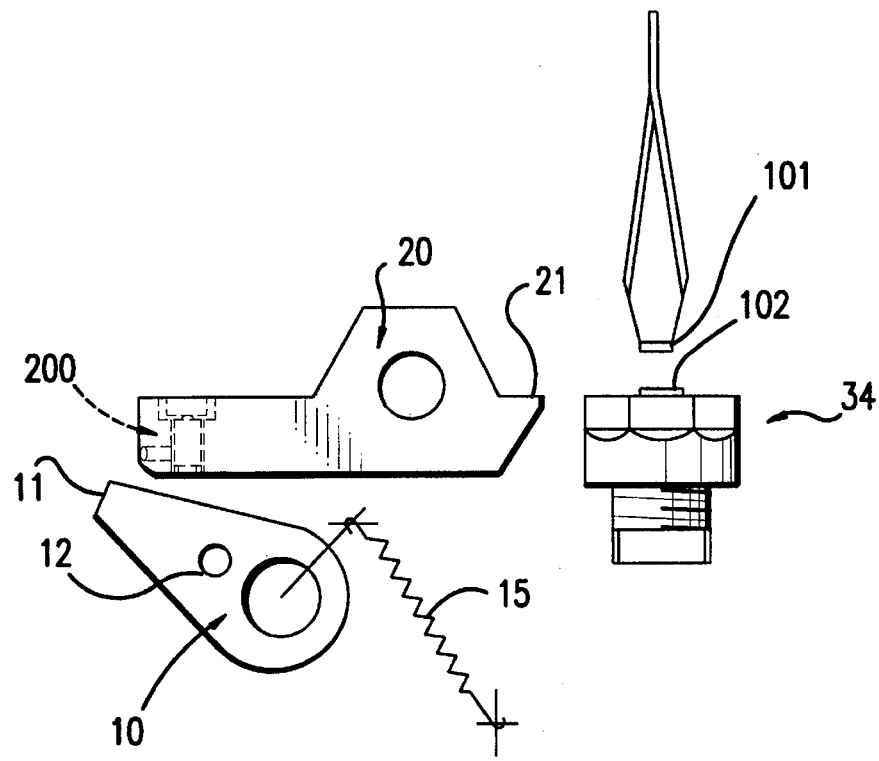
FIG. 3 is a schematic side view of the latch assembly, the positioning arm and the floating collet spring block assembly according to an embodiment of the present invention in the alignment position.
Figure 4:
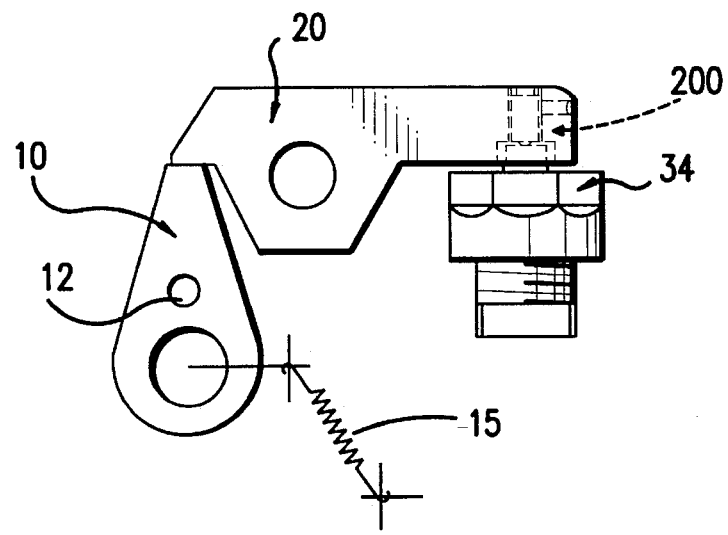
FIG. 4 is a schematic side view of the latch assembly, the positioning arm and the floating collet spring block assembly shown in FIG. 3 in the pick-up position.
Figure 5:
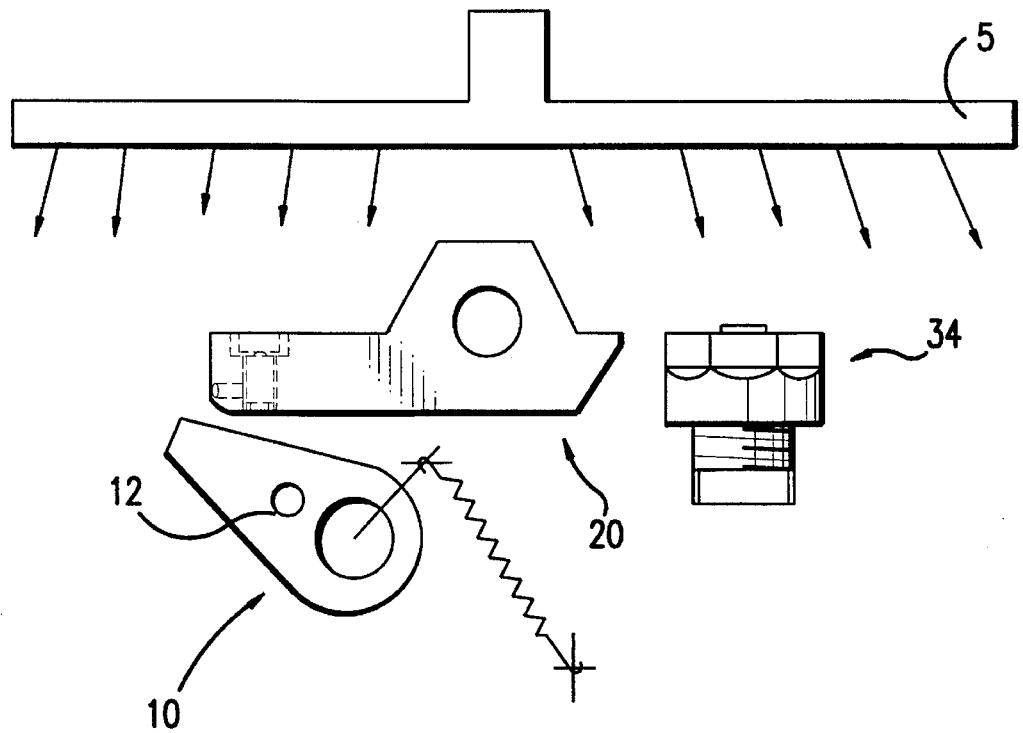
FIG. 5 is a schematic side view of the latch assembly, the positioning arm and the floating collet spring block assembly shown in FIG. 3 in the coating position.
Figure 6:
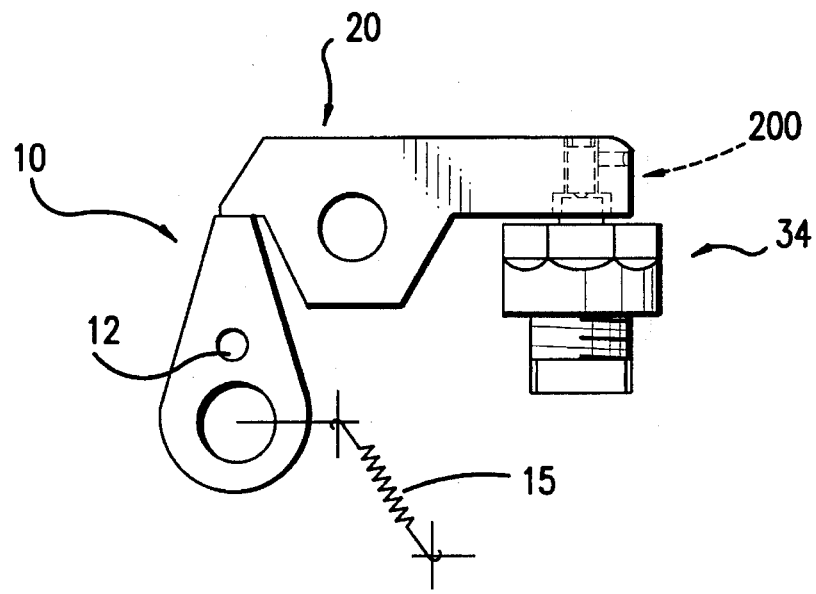
FIG. 6 is a schematic side view of the latch assembly, the positioning arm and the floating collet spring block assembly shown in FIG. 3 in the bonding position.

Part 101 is aligned on part 102, as shown in FIG. 3. This can be accomplished manually by the user or automatically by a mechanical assembly, not shown. When the latch assembly 10 is released, the positioning arm 20 is rotated by the positioning arm drive shaft 50, shown in FIG. 13. The positioning arm 20 is rotated to a position, shown in FIG. 4, where the positioning arm 20 can pick up part 101. The positioning arm 20 includes a latch engaging surface 21 for engaging a positioning arm engaging surface 11 on the latch assembly 10. On an opposite end of the positioning arm 20 is a swivel mount assembly 200, shown in detail in FIGS. 7–9. The latch assembly 10 may be held in the position shown in FIG. 3 by a detent assembly. The detent assembly includes a recess 12 in the latch assembly 10. The detent assembly also includes a bracket 13 having a biasing assembly 14 such as, for example, a spring biased ball screw. The biasing assembly 14 engages the recess 12 in the latch assembly such that the positioning arm 20 is maintained in a flat position during the coating operation, as shown in FIG. 5. When the positioning arm 20 is rotated to the position shown in FIG. 4 and 6, the bias of spring 15 releases the detent assembly 12 so that the latch assembly 10 can rotate to the positions shown in FIGS. 4 and 6.

The swivel mount assembly 200 is mounted to the positioning arm 20 and supports the part 101. The swivel mount assembly 200 provides a self alignment ability that eliminates uneven load distribution. When the load is applied a slight bending of the positioning arm 20 can contribute to a misalignment of the parts 101 and 102. The swivel mount assembly 200 in conjunction with the floating collet spring block assembly 30 accommodates these changes in position and maintains alignment.

Figure 7:
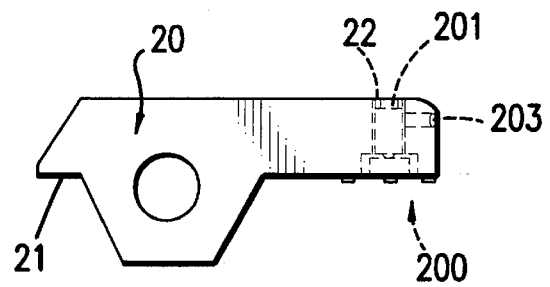
FIG. 7 is a schematic side view of the positioning arm according to an embodiment of the present invention.
Figure 8:
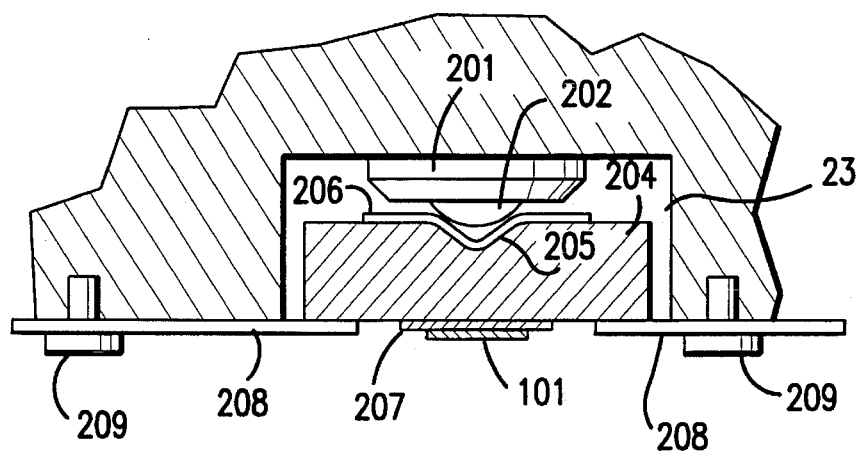
FIG. 8 is an enlarged sectional view of the swivel mount plate of the positioning arm shown in FIG. 7.
Figure 9:
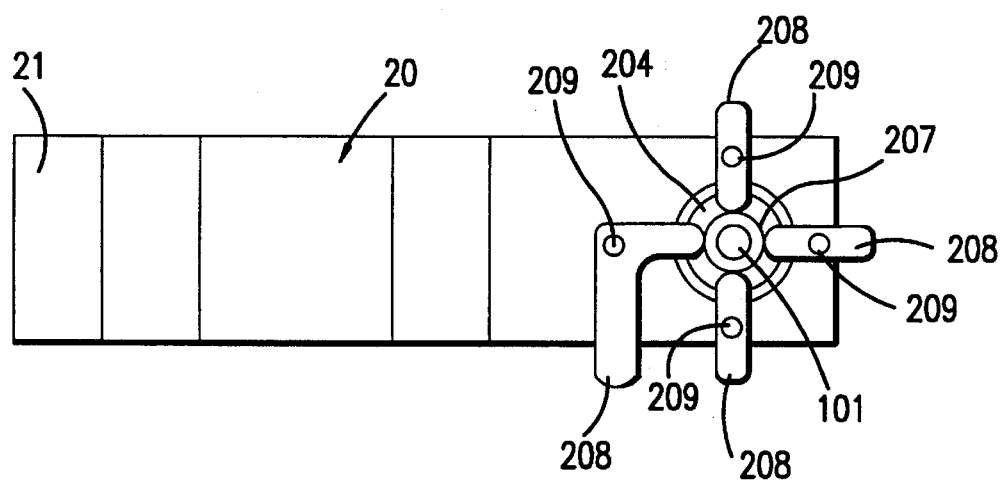
FIG. 9 is a schematic bottom view of the positioning arm shown in FIG. 7 according to an embodiment of the present invention.

As shown in FIGS. 7–9, the swivel mount assembly 200 includes a ball tipped screw 201 that is threadably engaged with an opening 22 extending through an end of the positioning arm 20. The screw 201 includes a ball 202 located on one end. A portion of the end of the screw 201 and the ball 202 project into a cavity 23 in the positioning arm 20. A locking screw 203 is provided to limit the movement of the ball tipped screw 201 within the opening 22.

A swivel plate 204 is positioned within the cavity 23, as shown in FIG. 8. The swivel plate 204 includes an indentation 205 on one side for engaging the ball 202 of the ball tipped screw 201. The surface of the plate 204 is coated with a layer 206 of friction reducing material (e.g., a TEFLON sheet or some other suitable friction reducing material). An opposite surface of the swivel plate 204 includes an adhesive layer 207. The adhesive layer 207 is composed of a wax material that is frequently used for polishing semiconductor wafers, although other suitable adhesives can be used. The semi-fluid and plastic behavior of the layer 207 permits part 101 to flex slightly to conform to slight curvatures and irregularities in part 102. Additionally, the layer 207 holds the part 101 such that it can be automatically adjusted in the event of uneven loading. Furthermore, the layer 207 distributes the bonding load to prevent cracking of part 101 as well as produce a gradual rise in pressure on part 101.

The swivel mount plate assembly 200 further includes pivoting spring clips 208 having pivot pins 209. The spring clips 208 maintain the swivel mount plate 204 within cavity 23 during movement of the positioning arm 20 between the positions shown in FIGS. 3–6. The spring clips 208 are rotated 90 degrees about pivot pins 209 to release the swivel mount plate 204 from the cavity 23. Other suitable retaining members may be substituted for the spring clips 208 (e.g., a threaded collar engaging the surface of cavity 23 and the surface of the mount plate 204 containing the adhesive layer 207). The swivel mounting plate and floating mounting assembly permit part 101 to achieve a proper orientation relative to the part 102 thereby reducing the risk of damage due to high momentary loads of initial contact.

The fixture mounting device 1 further includes a restraint lever 40, shown in FIG. 2, mounted to the fixture adapter plate 2. The restraint lever 40 includes a lever arm 41 pivotally supported by pivot pin 42 to the fixture adapter plate 2 by a pair of supports 43. Positioned under one end of the lever arm 41 is a cam assembly 44. The cam assembly 44 is operated by a cam assembly drive shaft 60, shown in FIG. 13. An opposite end of the lever arm 41 includes a pair of arms 41a and 41b, as shown in FIG. 1. Each arm 41a and 41b includes a screw 45. The screws 45 contact the top plate 35 of the floating collet spring block assembly 30 and compress springs 38. The compression of the springs 38 can be adjusted by adjusting the screws 45.

The restraint lever 40 compresses or releases the floating collet spring block assembly 30 depending on the position of the cam assembly 44. When the restraint lever 40 releases the floating collet spring block assembly 30, the compression springs 38 apply a bonding force to bond parts 101 and 102 together.

The fixture mounting device 1 supports parts 101 and 102 for coating. The fixture mounting plate 2 is mounted to a turntable 3 within a vacuum chamber assembly 4, shown in FIG. 13. Located within the vacuum chamber assembly 4 are a plurality of coating sources 5a–c, shown in FIGS. 13. Each coating source 5 deposits a separate material on the wafer 101 and the buffer rod 102. Although a single coating source can be employed for coating different materials.

Figure 13:
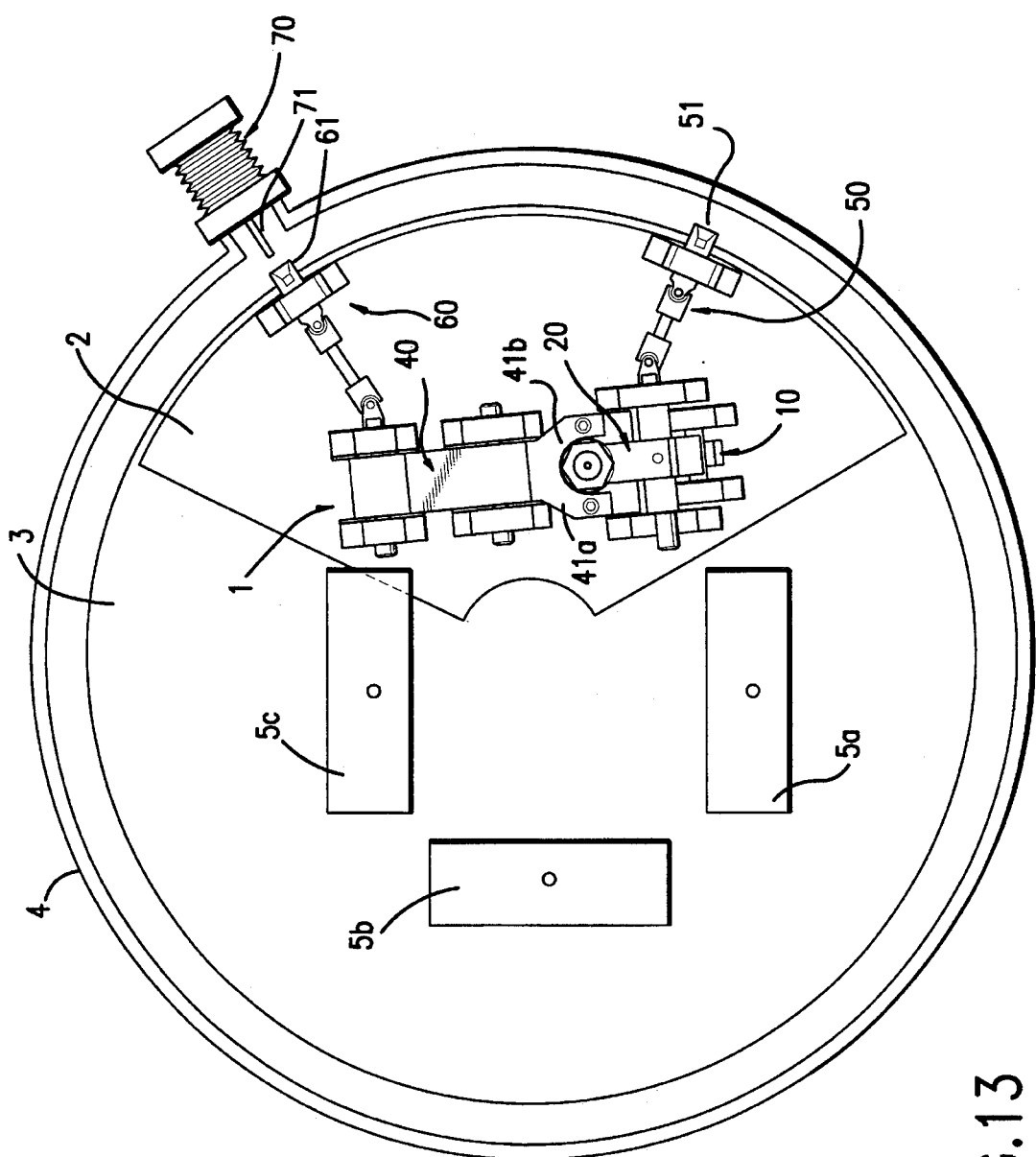
FIG. 13 is top view of the latch assembly, positioning arm, floating collet spring block assembly and restraint lever as shown in FIG. 1 positioned on an adapter plate within a vacuum chamber assembly according to an embodiment of the present invention.

As shown in FIG. 13, the vacuum chamber assembly 4 includes a single feedthrough mechanism 70 that is capable of rotary and linear motion. The single feedthrough mechanism 70 reduces the number of ports or wall penetrations in the vacuum chamber assembly 4. This reduces the impact the ports have on the vacuum within the chamber. The tip of a key member 71 can engage a complementary socket 51 on the positioning arm drive shaft 50 and a complementary socket 61 on the cam assembly drive shaft 60 to operate the positioning arm 20 and the restraining lever 40, respectively. This can be accomplished by moving the feedthrough mechanism 70 in a linear manner. The positioning arm 20 is operated by moving the turntable 3 such that the feedthrough mechanism 70 is aligned with the positioning arm drive shaft 50. Similarly, the cam assembly 44 is rotated by moving the turntable 3 such that the feedthrough mechanism 70 is aligned with the cam assembly drive shaft 60. Once the key member 71 is engaged with the either socket 51 or 61, the feedthrough mechanism 70 is rotated to operate the positioning arm 20 or the restraining lever 40. Additionally, the latch assembly 10 may include a complementary socket (not shown) such that the feedthrough mechanism 70 can also operate the latch assembly.

In an alternative embodiment, a pair of feedthrough mechanisms 70 can be provided such that the turntable does not have to be rotated to move the position of the positioning arm 20 and the restraining arm 40.

These embodiments of the present invention provide a simple manual assembly for operating the fixture mounting device 1 that requires no external electrical or mechanical power other than the physical input of a human operator. For coating systems that do not utilize a turntable arrangement where the apparatus may be in a fixed position, the actuating mechanism may be simplified.

Prior to the coating and bonding of parts 101 and 102, the floating collet spring block assembly 30 is calibrated to adjust the bonding load. The calibration is accomplished by installing in cavity 23 a miniature load cell, not shown, of the same thickness as the swivel mount assembly 200. The tip of the key member 71 is brought into engagement with socket 51. The feedthrough mechanism 70 is then rotated to drive the positioning arm drive shaft 50. The positioning arm 20 is then set to the bonding position, shown in FIG. 6.

The turntable 3 is then rotated such that the key member 71 is aligned with the socket 61 of the cam assembly drive shaft 60. The feedthrough mechanism 70 is then rotated to drive the cam assembly drive shaft 60 to rotate the cam assembly 44. The screws 45 of the restraining lever 41 are then released from engagement with the top plate 35. The collet 31 is then pressed against the load cell in a manner similar to that shown in FIG. 6. The bonding load of the springs 38 can now be adjusted in the manner described above. When Belleville washers are employed as a spring device, individual washers can be added or removed to adjust the bonding load. Once the desired bonding load is achieved, the latch assembly 10 is released and the positioning arm 20 is rotated to a position shown in FIG. 2. The load cell can then be removed. The pre-calibration of the load springs 38 permits a bonding load to be applied without the need of externally supplied electrical or hydraulic power.

The process of coating parts 101 and 102 will now be described. Prior to mounting parts 101 and 102, the positioning arm 20 is rotated to a position shown in FIG. 3. This is accomplished by aligning the key member 71 of the feedthrough mechanism 70 with the positioning arm drive shaft 50. The feedthrough mechanism 70 is then rotated to operate the positioning arm drive shaft 50 to rotate the retaining arm to the aligning position, shown in FIG. 3. These actions may be performed by hand at ambient room pressure.

Part 102 is then inserted in channel 32 on the collet 31. The collet stop shaft 33 is threaded into place to limit movement of part 102 during the bonding operation. The collet 31 is then located within the collet holder sleeve 34b. The cap 34a is threaded into place and the collet holder 34 is then placed in opening 35a in the top plate 35.

The turntable 3 is rotated such that key member 71 of the feedthrough mechanism 70 is brought into alignment with the socket 61 of the cam assembly drive shaft 60. The cam assembly 44 is rotated such that the arms 41a and 41b and the screws 45 engage the top plate 35. This causes the springs 38 to compress. Part 101 is then aligned on a surface of part 102. Alternatively, these operations may be performed by hand.

The turntable 3 is again rotated to align the key member 71 with socket 61. The positioning arm 20 is then rotated in the manner described above to the position shown in FIG. 4. The adhesive layer 207 on the swivel mount assembly 200 contacts part 101. The turntable 3 is rotated so that the feedthrough mechanism 70 can operate the cam assembly drive shaft 50. The cam assembly 44 is rotated to release the restraining lever 40. The floating collet spring block assembly 30 applies the bonding load such that the metallic part 101 is pressed against the adhesive layer 207 to secure the part 101 to the layer 207. The cam assembly 44 is rotated to reengage the restraining lever 40 with the floating collet spring block assembly 30. The latch is manually released and the positioning arm 20 is then rotated to the coating position, shown in FIG. 5.

This accurate alignment permits part 102 (i.e., a buffer rod) to have pre-machined or ground features incorporated prior to bonding. This eliminates post bond processing of part 102. Part 101 (i.e., the metallic part such as a crystal wafer) is then not exposed to potential damage which can occur when normal lens grinding occurs.

No complex manipulator is required to pick-up, reorient and place the parts 101 and 102 in position. The pick-up technique used in embodiments of the present invention assures that part 101 returns to the same pre-aligned position automatically. The technique also increases repeatability between during bonding.

The vacuum chamber assembly 4 is then sealed and the vacuum is activated. The coating and bonding operations are performed under a vacuum with a single set-up so that the deposited films are completely free of oxide formation prior to bonding. Once the desired vacuum level is achieved (this can vary depending on the deposition process used), parts 101 and 102 are ready to be coated. Numerous coating processes (e.g., chemical vapor deposition, physical vapor deposition, sputtering) may be employed.

The turntable 3 is then rotated to align parts 101 and 102 with a coating source 5. The coating source 5 applies a layer of coating on the bonding surfaces of the parts 101 and 102. This arrangement is advantageous because a single coating source is used to simultaneously coat both parts. This ensures that the thickness of the layers on each of the parts is uniform.

Figure 14:
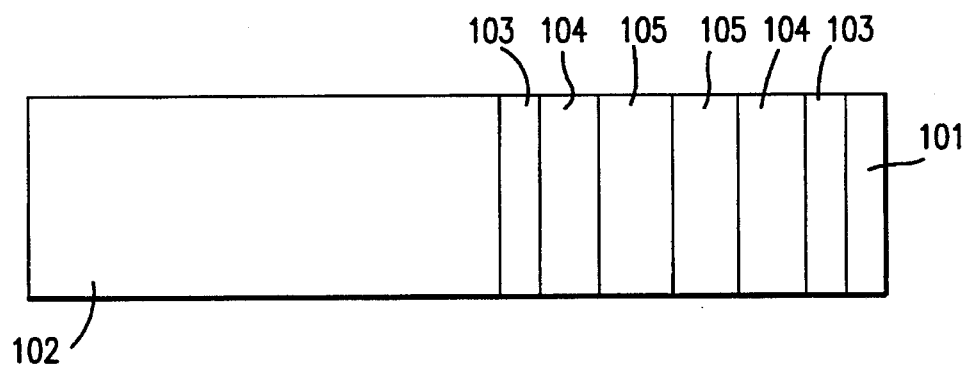
FIG. 14 is a side view illustrating the layers of metal between the buffer rod and the crystal according to an embodiment of the present invention.

In a present embodiment of the present invention, a layer of chromium 103, as shown in FIG. 14, is first applied to the parts at a first coating source 5a. The thickness of the layer of chromium is in the range of 100 to 200 Angstroms. The turntable 3 is then rotated to a second coating source 5b where a layer of gold 104 is then applied. The thickness of the layer of gold is in the range of 1000 to 1500 Angstroms. The turntable 3 is then rotated to a third coating source 5c where a layer of indium 105 is then applied. The thickness of the layer of indium is in the range of 1000 to 4000 Angstroms.

Once the coating process is complete, the turntable 3 is rotated to bring the feedthrough mechanism into alignment with the positioning arm drive shaft 50. The bonding process will now be described. The positioning arm 20 is then rotated to the bonding position, shown in FIG. 6. The spring biased latch assembly 10 then brings the positioning arm engaging surface 11 into contact with the latch engaging surface 21. The turntable 3 is then rotated to bring the feedthrough mechanism 70 into alignment with the cam assembly drive shaft 60. The cam assembly 44 is rotated to release the restraining lever 40. The springs 38 of the floating collet spring block assembly 30 then apply a bonding load to parts 101 and 102.

The floating collet spring block assembly 30 uses a purely mechanical form of energy storage with no external supply of electrical current or hydraulic fluid. In this way, embodiments of the present invention avoid the use of hydraulics as a source of bonding pressure thus eliminating the risk of a leak contaminating the vacuum system. Furthermore, the floating collet spring block assembly 30 can be moved on the turntable 3 within the vacuum chamber assembly 4 in any direction and any distance without the twisting, entanglement or shearing of the supply lines that limit the prior art devices.

The bonding load is applied under vacuum for a suitable period of time. The vacuum is then released to facilitate removal of the parts from the fixture mount assembly 1. Part 101 is still temporarily bonded to the swivel mount assembly 200. The spring clips 208 are then rotated to remove the swivel mount assembly 200 from the cavity 23 in the positioning arm 20. The positioning arm 20 is then rotated to a position shown in FIG. 3. The collet holder 34 is then removed from the floating spring collet assembly 30. The bonded parts are then removed from the collet assembly 34 by loosening the collet cap 34a. This relieves compression on collet 31 and releases the bonded parts. Part 102 now bonded to part 101 is then removed from the collet 31. The swivel mount assembly 204 can then be removed from part 101 by applying heat or by soaking in a suitable solvent to release part 101 from the adhesive layer 207. The parts 101 and 102 are bonded in a manner shown in FIG. 14.

The invention has been described with reference to the embodiments thereof which are intended to be illustrative. Various changes and modifications may be made without departing from the spirit and scope of the invention as defined in the following claims.

What is claimed is:

1. An apparatus for coating and bonding a pair of parts together in a vacuum, wherein each of said pair of parts includes a bonding surface, said apparatus comprising:

a floating mount assembly for holding one of said pair of parts;

a pivoting mount assembly for holding the other of said pair of parts, said pivoting mount assembly pivoting between a bonding position wherein said bonding surfaces are arranged to face each other and a coating position wherein said bonding surfaces are laterally spaced from each other; and a first coating source for depositing a thin film of a metal onto said bonding surfaces, said coating source being configured to simultaneously coat each of said bonding surfaces.

2. The apparatus according to claim 1, further comprising:

a second coating source for depositing a second thin film of a metal simultaneously onto each of said bonding surfaces.

3. The apparatus according to claim 2, further comprising:

a third coating source for depositing a third thin film of a metal simultaneously onto each of said bonding surfaces.

4. The apparatus according to claim 1, wherein said floating mount assembly includes a support for holding said one part and a biasing assembly capable of transmitting a bonding force to said support and said one part.

5. The apparatus according to claim 4, wherein said support comprises a collet having an opening adapted to receive said one part and a collet holder to secure said collet to a top plate on said floating mount assembly.

6. The apparatus according to claim 5, wherein said support further includes a collet stop shaft positioned within said opening to limit movement of said one part within said opening.

7. The apparatus according to claim 1, further comprising:

a bonding load restraining assembly.

8. The apparatus according to claim 7, wherein said bonding load restraining assembly includes a pivoting lever, one end of said lever being configured to contact said floating mount assembly and restrain said bonding load in a first position and release said floating mount assembly and said bonding load in a second position.

9. The apparatus according to claim 8, further comprising a cam assembly for moving said restraining lever between said first position and said second position.

10. The apparatus according to claim 7, further comprising:

a vacuum chamber having a turntable contained therein, wherein said floating mount assembly, said pivoting mount assembly and said bonding load restraining assembly are mounted on said turntable.

11. The apparatus according to claim 10, further comprising at least one feedthrough mechanism configured to control the operation of said pivoting mount assembly and said bonding load restraining assembly through said vacuum chamber.

12. The apparatus according to claim 11, said apparatus having only a single feedthrough mechanism, whereby said turntable rotates such that said single feedthrough mechanism can alternately operate said pivoting mount assembly and said bonding load restraining assembly.

13. The apparatus according to claim 1, wherein said pivoting mount assembly includes a pivoting arm, one end of said arm having a surface that engages a spring biased latch assembly when in said bonding position and an opposite end of said pivoting arm having a swivel mount assembly for mounting said other part.

14. The apparatus according to claim 13, wherein said swivel mount assembly includes a plate having an adhesive layer on one surface to secure said other part to said swivel mount assembly.

15. The apparatus according to claim 14, wherein said swivel mount assembly further includes a recess in a surface opposite said surface having the adhesive layer, said recess engages a ball tipped screw assembly located in said pivoting arm such that said swivel mount assembly is capable of moving with respect to said pivot arm.

16. The apparatus according to claim 15, wherein said swivel mount assembly further includes a layer of friction reducing material positioned between said recess and said ball tipped screw.

17. A method of coating and bonding a pair of parts together, each part having a surface to be bonded, comprising the steps of:

Securing said pair of parts to a coating and bonding apparatus;

Orienting said pair of parts for coating such that said surface to be bonded on each part is oriented in the same direction;

Applying at least two thin films of metal onto each said surface to be bonded, by orienting the parts under a first coating source and applying a first thin film, and orienting the parts under a second coating source and applying second thin film on top of said first thin film;

Orienting said pair of parts such that said surfaces to be bended are abutting; and Applying a bonding load onto said parts.

18. The method according to claim 17, wherein the step of applying at least two thin films of metal includes orienting the parts under a third coating source and applying a third thin film on top of said second thin film.

19. The method according to claim 1, wherein the step of securing said pair of parts to a coating and bonding apparatus comprises the steps of:

mounting one of said pair of parts in a floating block assembly;

aligning the other of said pair of parts on said one part; and positioning a pivoting mount assembly over said other part to secure said other part to said pivoting mount assembly.

20. The method according to claim 19, wherein the step of positioning a pivoting mount assembly includes pivoting a pivot arm on said pivoting mount assembly into contact with the said other part on said one part such that an adhesive layer on said pivot arm contacts said other part.

21. The method according to claim 20, further comprising the step of pressing said other part onto said adhesive layer.

22. The method according to claim 1, wherein the step of orienting said pair of parts for coating includes pivoting a pivoting mount assembly such that said surface to be bonded on each part is oriented in the same direction.

23. The method according to claim 1, wherein the step of orienting said pair of parts such that said surfaces to be bonded are abutting includes pivoting a pivoting mount assembly such that said other part is positioned over said one part.

24. The method according to claim 1, wherein the step of applying a bonding load onto said parts includes releasing a restraining lever to apply said bonding load.

25. The method according to claim 24, wherein said restraining lever is released from engagement with floating mounting assembly and said floating mounting assembly provides a bonding load to bond said pair of parts together.

26. An apparatus for coating and bonding a pair of parts together in a vacuum, wherein each of said pair of parts includes a bonding surface, said apparatus comprising:

floating mounting means for holding one part of said pair of parts and applying a bonding load for bonding said parts together;

pivoting mounting means for holding the other of said pair of parts, said pivoting mounting means pivoting said other part between a bonding position wherein said bonding surfaces face each other and a coating position wherein said bonding surfaces are laterally spaced from each other;

coating means for applying at least one thin film of a metal onto said bonding surface on each of said pair of parts, said coating means simultaneously coating said bonding surfaces; and restraining means for compressing said bonding load when said pivoting mounting means is in said coating position.

* * * * *